United States Patent
Sun et al.

(10) Patent No.: US 11,610,103 B2
(45) Date of Patent: Mar. 21, 2023

(54) ONE TIME PROGRAMMABLE NON-VOLATILE MEMORY CELL ON GLASS SUBSTRATE

(71) Applicant: eMemory Technology Inc., Hsin-Chu (TW)

(72) Inventors: Wein-Town Sun, Hsinchu County (TW); Woan-Yun Hsiao, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 138 days.

(21) Appl. No.: 17/151,774

(22) Filed: Jan. 19, 2021

(65) Prior Publication Data

US 2021/0249426 A1    Aug. 12, 2021

Related U.S. Application Data

(60) Provisional application No. 62/975,671, filed on Feb. 12, 2020.

(51) Int. Cl.
| | | |
|---|---|---|
| *G06N 3/063* | (2023.01) | |
| *G06N 3/04* | (2023.01) | |
| *H01L 27/24* | (2006.01) | |
| *H01L 23/522* | (2006.01) | |
| *H01L 27/112* | (2006.01) | |
| *H01L 45/00* | (2006.01) | |

(52) U.S. Cl.
CPC ............... *G06N 3/063* (2013.01); *G06N 3/04* (2013.01); *H01L 23/5226* (2013.01); *H01L 27/11206* (2013.01); *H01L 27/2436* (2013.01); *H01L 45/146* (2013.01); *H01L 45/1641* (2013.01)

(58) Field of Classification Search
CPC ........... H01L 23/5226; H01L 27/11206; H01L 27/2436; H01L 45/146; H01L 45/1641; H01L 27/11213; G06N 3/063; G06N 3/04; G06N 3/0625; G05F 1/56
See application file for complete search history.

(56) References Cited

U.S. PATENT DOCUMENTS

| | | | | |
|---|---|---|---|---|
| 4,037,243 A | * | 7/1977 | Hoffman | ............ H01L 29/8616 365/182 |
| 5,627,779 A | * | 5/1997 | Odake | ................ H01L 29/7883 365/185.12 |
| 6,208,012 B1 | | 3/2001 | Oishi | |
| 8,637,366 B2 | | 1/2014 | Herner et al. | |

(Continued)

*Primary Examiner* — Galina G Yushina
(74) *Attorney, Agent, or Firm* — WPAT, PC

(57) ABSTRACT

A one time programmable non-volatile memory cell includes a storage element. The storage element includes a glass substrate, a buffer layer, a polysilicon layer and a metal layer. The buffer layer is disposed on the glass substrate. The polysilicon layer is disposed on the buffer layer. A P-type doped region and an N-type doped region are formed in the polysilicon layer. The metal layer is contacted with the N-type doped region and the P-type doped region. The metal layer, the N-type doped region and the P-type doped region are collaboratively formed as a diode. When a program action is performed, the first diode is reverse-biased, and the diode is switched from a first storage state to a second storage state. When a read action is performed, the diode is reverse-biased and the diode generates a read current.

11 Claims, 5 Drawing Sheets

(56) References Cited

U.S. PATENT DOCUMENTS

| | | | | |
|---|---|---|---|---|
| 2002/0117724 A1* | 8/2002 | Ariyoshi | ............... | H01L 27/088 438/467 |
| 2005/0042825 A1* | 2/2005 | Kitamura | .............. | H01L 27/224 438/257 |
| 2006/0007727 A1* | 1/2006 | Harrison | ................ | G11C 16/04 365/147 |
| 2007/0221919 A1* | 9/2007 | Sato | ..................... | H01L 31/044 136/254 |
| 2011/0254122 A1* | 10/2011 | Noda | ................. | H01L 27/1021 438/479 |
| 2017/0125402 A1* | 5/2017 | Zhou | .................... | H01L 23/535 |
| 2018/0203355 A1* | 7/2018 | De Silva | .................. | G03F 7/11 |

* cited by examiner

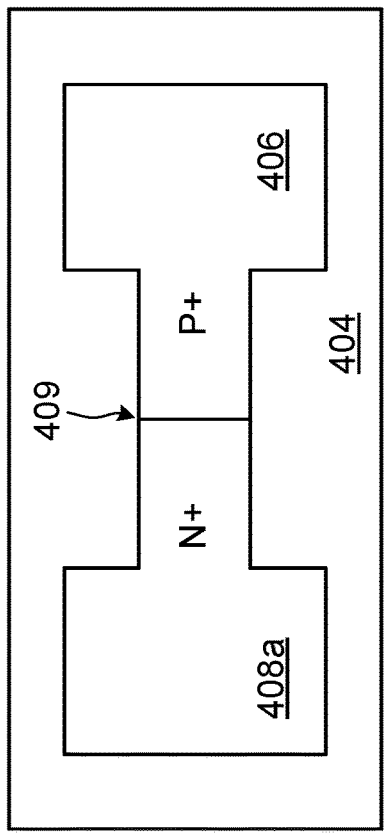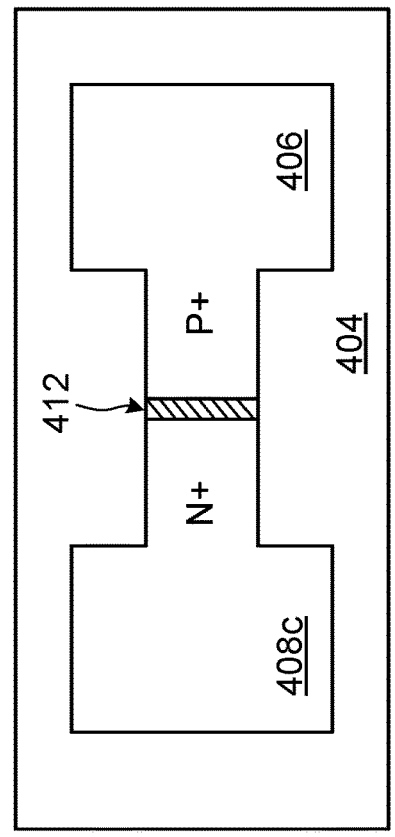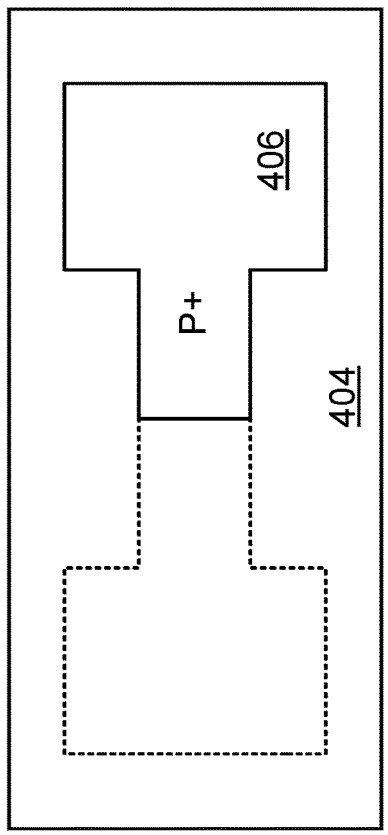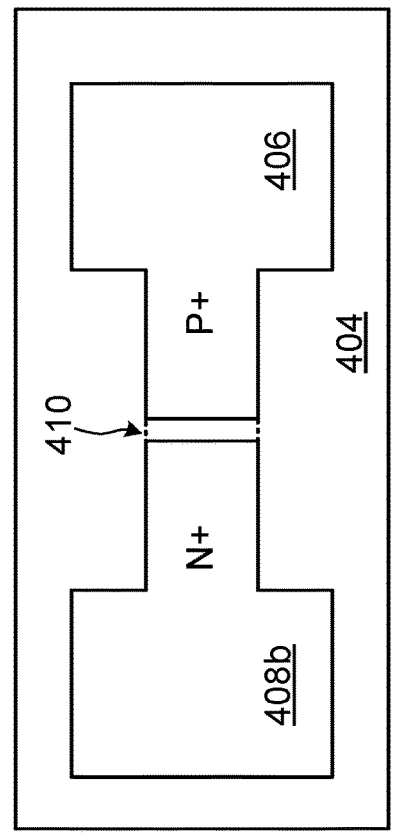

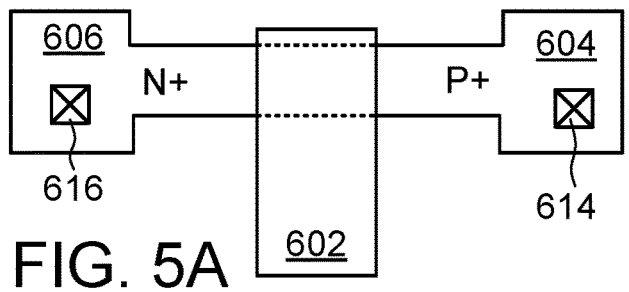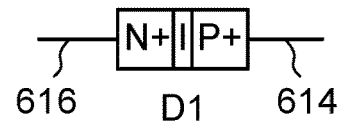
FIG. 5A  FIG. 5B
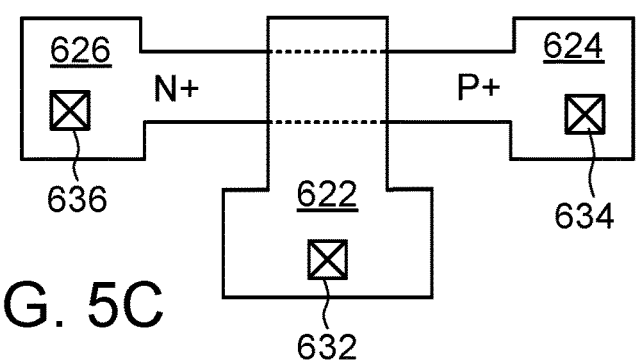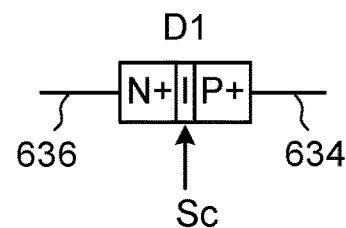
FIG. 5C  FIG. 5D
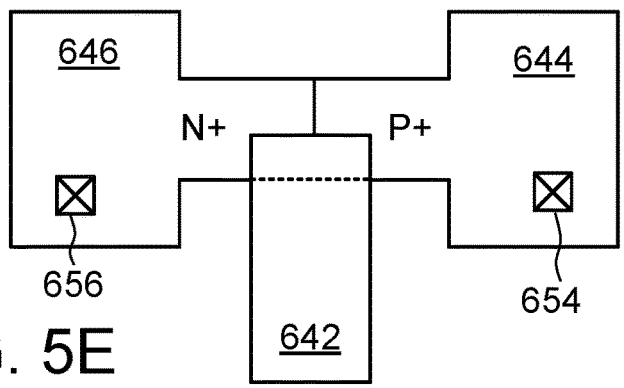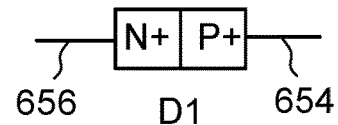
FIG. 5E  FIG. 5F
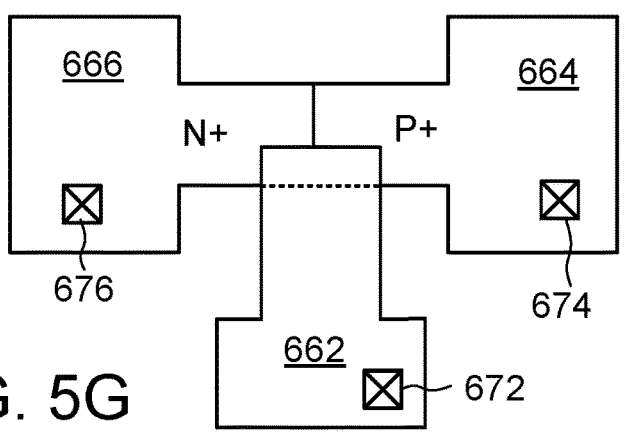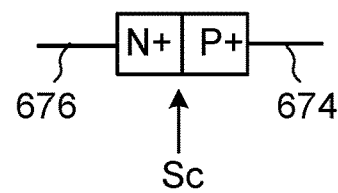
FIG. 5G  FIG. 5H

ONE TIME PROGRAMMABLE NON-VOLATILE MEMORY CELL ON GLASS SUBSTRATE

This application claims the benefit of U.S. provisional application Ser. No. 62/975,671, filed Feb. 12, 2020, the subject matter of which is incorporated herein by reference.

FIELD OF THE INVENTION

The present invention relates to a memory cell, and more particularly to a one time programmable (OTP) non-volatile memory cell on a glass substrate.

BACKGROUND OF THE INVENTION

As known, the thin film transistor (TFT) manufactured through a low temperature poly-silicon (LTPS) process has low power consumption, high quality and high response speed. Consequently, the thin film transistor is widely used in the field of display panels. However, the application of the thin film transistors to the field of memories will encounter many difficulties.

For example, in the manufacturing process of the low temperature poly-silicon thin film transistor, the channel length is about 3 μm and the thickness of the gate dielectric layer is about 500~1000 angstroms (Å) according to the design rule of the thin film transistor. If the thin film transistor is manufactured as a floating gate transistor and the floating gate transistor is served as a storage element of the non-volatile memory cell, some drawbacks occur because the channel length of this floating gate transistor is too long. For example, regardless of whether electrons are injected into the floating gate through a channel hot electron effect (CHE effect) or a Fowler-Nordheim tunneling effect (FN tunneling effect), the magnitude of the received bias voltage is very high. The high bias voltage may cause damage to the floating gate transistor.

SUMMARY OF THE INVENTION

The present invention provides a non-volatile memory cell. The non-volatile memory cell is formed on a glass substrate by using a low temperature poly-silicon TFT process.

An embodiment of the present invention provides a one time programmable non-volatile memory cell. The one time programmable non-volatile memory cell includes a storage element. The storage element includes a glass substrate, a buffer layer, a first polysilicon layer, a gate dielectric layer, an interlayer dielectric layer, a first metal layer and a second metal layer. The buffer layer is disposed on the glass substrate. The first polysilicon layer is disposed on the buffer layer. A first P-type doped region and a first N-type doped region are formed in the first polysilicon layer. The gate dielectric layer covers the first polysilicon layer. The interlayer dielectric layer covers the gate dielectric layer. The first metal layer is disposed on the interlayer dielectric layer. The first metal layer is contacted with the first N-type doped region through a first via. The second metal layer is disposed on the interlayer dielectric layer. The second metal layer is contacted with the first P-type doped region through a second via. The first metal layer, the first N-type doped region, the first P-type doped region and the second metal layer are collaboratively formed as a first diode. When a program action is performed, the first diode receives a program voltage. In response to the program voltage, the first diode is reverse-biased, and the first diode is switched from a first storage state to a second storage state. When a read action is performed, the first diode receives a read voltage. In response to the read voltage, the first diode is reverse-biased and the first diode generates a read current.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 10 is a schematic circuit diagram illustrating the equivalent circuit of the storage element according to the embodiment of the present invention;

FIGS. 3A to 3D schematically illustrate the photolithography processes for the storage element of the OTP non-volatile memory cell;

FIGS. 5A and 5B schematically illustrate a fourth example of the doped region pattern on the polysilicon layer and the equivalent circuit of the storage element;

FIGS. 5C and 5D schematically illustrate a fifth example of the doped region pattern on the polysilicon layer and the equivalent circuit of the storage element;

FIGS. 5E and 5F schematically illustrate a sixth example of the doped region pattern on the polysilicon layer and the equivalent circuit of the storage element; and FIGS. 5G and 5H schematically illustrate a seventh example of the doped region pattern on the polysilicon layer and the equivalent circuit of the storage element.

DETAILED DESCRIPTION OF PREFERRED EMBODIMENTS

The present invention provides a one time programmable (OTP) non-volatile memory cell. A diode is manufactured by using a low temperature poly-silicon thin film transistor process. The diode is used as a storage element of the non-volatile memory cell.

Figure 1A:
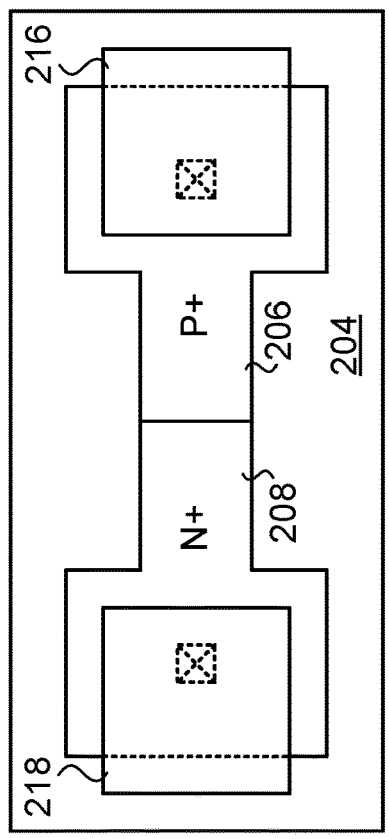
FIG. 1A is a schematic cross-sectional view illustrating a storage element according to an embodiment of the present invention.
Figure 1B:
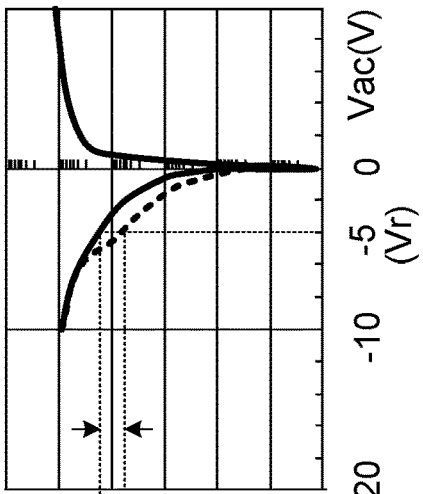
FIG. 1B is a schematic top view illustrating the relationship between a polysilicon layer and two metal layers of the storage element according to the embodiment of the present invention.

Hereinafter, a storage element of an OTP non-volatile memory cell according to an embodiment of the present invention will be described with reference to FIGS. 1A, 1B and 1C. FIG. 1A is a schematic cross-sectional view illustrating a storage element according to an embodiment of the present invention. FIG. 1B is a schematic top view illustrating the relationship between a polysilicon layer and two metal layers of the storage element according to the embodiment of the present invention. FIG. 1C is a schematic circuit diagram illustrating the equivalent circuit of the storage element according to the embodiment of the present invention.

Please refer to FIG. 1A. Firstly, a buffer layer 204 is formed on a glass substrate 202, and a polysilicon layer is formed on the buffer layer 204. Then, two ion implantation processes are performed on the polysilicon layer, and thus a P-type doped region (P+) 206 and an N-type doped region (N+) 208 are formed. Then, a gate dielectric layer 210 and an interlayer dielectric layer 214 are sequentially formed to cover the P-type doped region (P+) 206 and the N-type doped region (N+) 208. Then, two metal layers 216 and 218 are formed on the interlayer dielectric layer 214 and contacted with the P-type doped region (P+) 206 and the N-type doped region (N+) 208 through vias in the gate dielectric layer 210 and the interlayer dielectric layer 214. Then, an organic planarization layer 220 is formed to cover the metal layers 216, 218 and the interlayer dielectric layer 214.

Please refer to FIGS. 1A and 1C. A P-N junction is formed between the P-type doped region (P+) 206 and the N-type doped region (N+) 208. The metal layer 216 is an anode (a) and connected to the P-type doped region (P+) 206. The metal layer 218 is a cathode (c) and connected to the N-type doped region (N+) 208. In other words, the metal layer 216, the P-type doped region (P+) 206, the N-type doped region (N+) 208 and the metal layer 218 are collaboratively formed as a diode. In the equivalent circuit of FIG. 10, Vac is a bias voltage of the diode, and I is a reverse bias current.

Figure 1E:
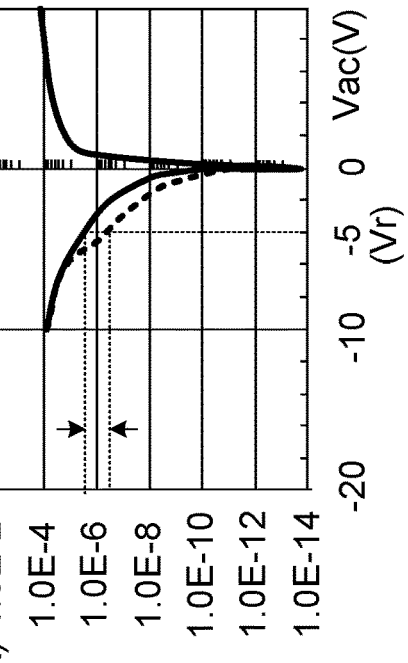
FIGS. 1D and 1E schematically illustrate the bias voltages for the storage element of the non-volatile memory cell when a program action and a read action are performed.
Figure 1D:
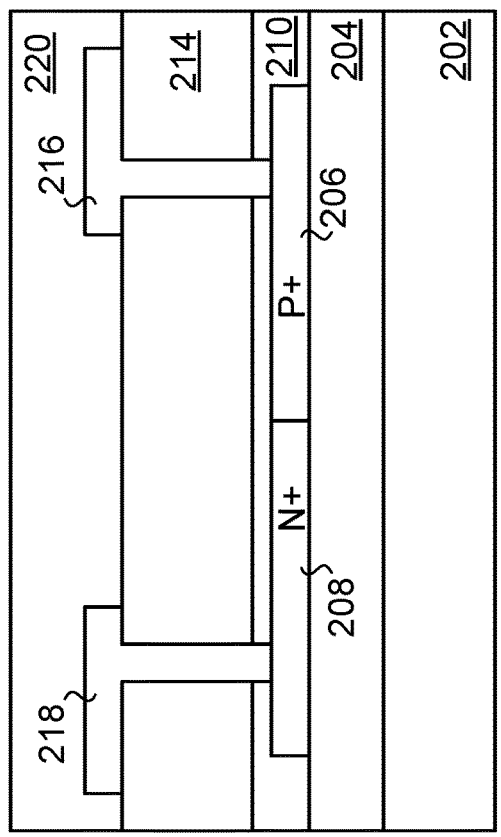
Figure 1C:
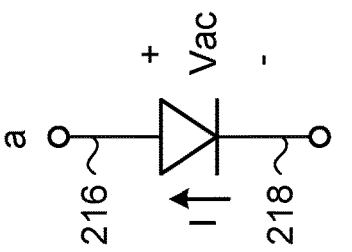

FIGS. 1D and 1E schematically illustrate the bias voltages for the storage element of the non-volatile memory cell when a program action and a read action are performed. When the program action is performed, the diode is reverse-biased. In addition, a program voltage Vpp is applied to the two terminals of the diode to change the storage state of the diode. For example, the anode (a) of the diode receives the ground voltage (0V), and the cathode (c) of the diode receives a positive voltage. Consequently, the diode is reverse-biased. That is, Vac is lower than zero.

In an embodiment, the received program voltage Vpp of the diode is lower than a breakdown voltage of the diode during the program action. Consequently, the diode results in junction breakdown, and the junction characteristic of the diode is changed. Generally, if the absolute value of the program voltage Vpp is higher than the absolute value of the breakdown voltage in the reverse-biased condition, the diode results in junction breakdown.

Please refer to FIG. 1D. When the bias voltage Vac is −20V, the diode results in junction breakdown. Meanwhile, the reverse bias current I is about 263 μA. In other words, the bias voltage Vac of −20V is the program voltage Vpp.

As mentioned above, when the program action is performed, the program voltage Vpp is selectively provided to the two terminals of the diode to control the storage state of the diode. For example, if the program voltage is not received by the two terminals of the diode, the diode is maintained in a first storage state. Whereas, if the program voltage is received by the diode and the junction breakdown occurs, the diode is programmed into a second storage state. Since the junction characteristic change of the diode is irreversible, the diode manufactured by the low temperature poly-silicon thin film transistor process is suitable as the storage element of the OTP non-volatile memory cell.

During the read action, the diode is reverse-biased and the diode receives a read voltage Vr. The storage state of the diode is determined according to the magnitude of a read current generated by the diode.

Please refer to FIG. 1E. The dotted curve denotes the voltage-current relationship of the diode in the first storage state, and the solid curve denotes the voltage-current relationship of the diode in the second storage state. When the bias voltage Vac is −5V, the reverse bias current I of the diode in the first storage state is about 0.8 μA, and the reverse bias current I of the diode in the second storage state is about 6.0 μA. That is, the difference between the reverse bias currents in the two storage states is about 5.2 μA.

In other words, during the read action, the bias voltage Vac of −5V is a read voltage Vr and the reverse bias current I of the diode is a read current Ir. According to the read current Ir, a sensing circuit (not shown) connected with the diode judges the storage state of the diode.

For example, the sensing circuit is a current comparing circuit for comparing a reference current Iref with the read current Ir. For example, the magnitude of the reference current Iref is in the range between 0.8 μA and 6.0 μA. If the read current Ir is lower than the reference current Iref, the current comparing circuit judges that the diode is in the first storage state. Whereas, if the read current Ir is higher than the reference current Iref, the current comparing circuit judges that the diode is in the second storage state.

In the above embodiment, the program voltage Vpp is −20V, and the read voltage Vr is −5V. It is noted that the magnitude of the program voltage Vpp and the magnitude of the read voltage Vr are not restricted. That is, the magnitude of the program voltage Vpp and the magnitude of the read voltage Vr may be varied according to the practical requirements.

Figure 2B:
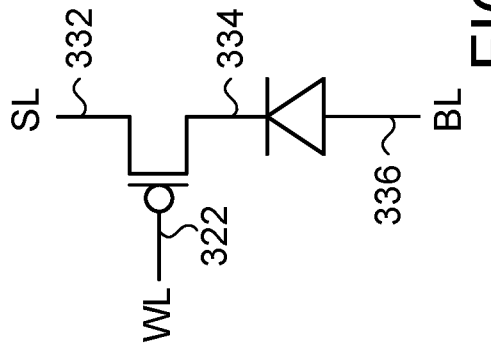
FIG. 2B is a schematic circuit diagram illustrating the equivalent circuit of the OTP non-volatile memory cell according to the first embodiment of the present invention.
Figure 2D:
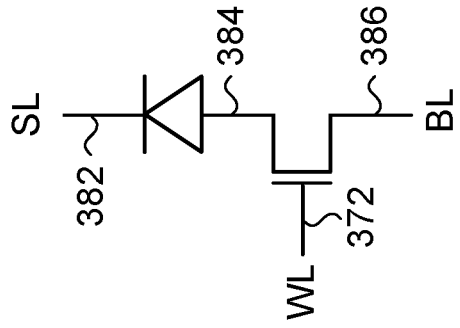
FIG. 2D is a schematic circuit diagram illustrating the equivalent circuit of the OTP non-volatile memory cell according to the second embodiment of the present invention.
Figure 2A:
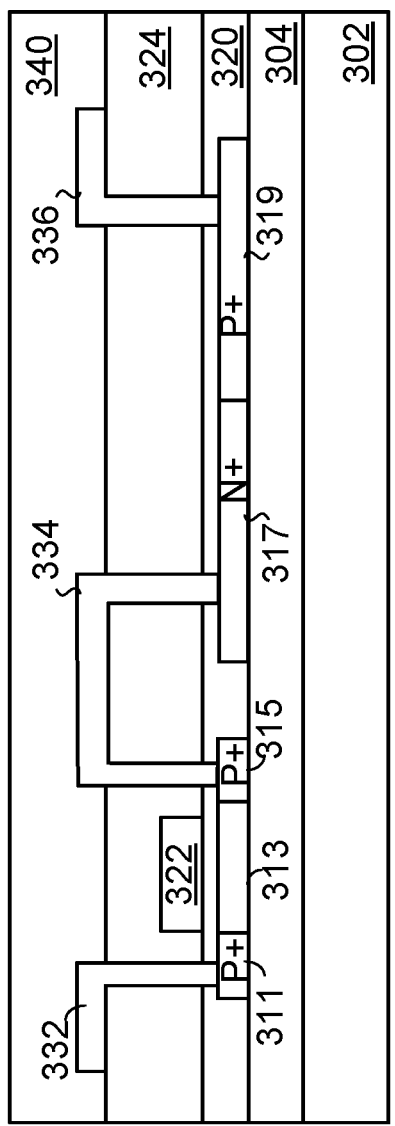
FIG. 2A is a schematic cross-sectional view illustrating an OTP non-volatile memory cell according to a first embodiment of the present invention.

The structure of the OTP non-volatile memory cell according to a first embodiment of the present invention will be described with reference to FIGS. 2A and 2B. FIG. 2A is a schematic cross-sectional view illustrating an OTP non-volatile memory cell according to a first embodiment of the present invention. FIG. 2B is a schematic circuit diagram illustrating the equivalent circuit of the OTP non-volatile memory cell according to the first embodiment of the present invention.

In this embodiment, the OTP non-volatile memory cell is manufactured by the low-temperature poly-silicon thin film transistor process. The OTP non-volatile memory cell comprises a switch element and a storage element. For example, the switch element is a P-type thin film transistor, and the storage element is a diode.

Please refer to FIG. 2A. Firstly, a buffer layer 304 is formed on a glass substrate 302, and two polysilicon layers are formed on the buffer layer 304. Then, two ion implantation processes are performed on the two polysilicon layers. Consequently, a P-type doped region (P+) 319 and an N-type doped region (N+) 317 are formed in the first polysilicon layer, and two P-type doped regions (P+) 311, 315 and a channel region 313 are formed in the second polysilicon layer. The channel region 313 is arranged between the two P-type doped regions (P+) 311 and 315. Then, a gate dielectric layer 320 is formed over the two polysilicon layers. After a gate layer 322 is formed on the gate dielectric layer 320, an interlayer dielectric layer (ILD) 324 is formed to cover the gate layer 322 and the gate dielectric layer 320. The gate layer 322 is located over the channel region 313. Then, three metal layers 332, 334 and 336 are formed on the interlayer dielectric layer 324. The first metal layer 336 is contacted with the P-type doped region (P+) 319 through a via. The second metal layer 334 is contacted with the N-type doped region (N+) 317 and the P-type doped region (P+) 315 through two vias. The third metal layer 332 is contacted with the P-type doped region (P+) 311 through a via. Then, an organic planarization layer 340 is formed to cover the metal layers 332, 334 and 336 and the interlayer dielectric layer 324. The first metal layer 336, the second metal layer 334 and the third metal layer 332 may be the same metal layer or different metal layers.

Please refer to FIG. 2B. The metal layer 332 is connected to a source line SL and used as the first drain/source terminal of the P-type thin film transistor. The gate layer 322 of the P-type thin film transistor is connected to a word line WL. The metal layer 334 is used as both of the second drain/source terminal of the P-type thin film transistor and the cathode of the diode. That is, the second drain/source terminal of the P-type thin film transistor is connected with the cathode of the diode. The metal layer 336 is connected to a bit line BL and used as an anode end of the diode.

When the program action is performed, a program voltage Vpp is provided to the region between source line SL and the bit line BL. That is, the voltage difference between the source line SL and the bit line BL is equal to the program voltage Vpp. After the word line WL receives an on voltage, the P-type thin film transistor is turned on and the diode is programmed to the second storage state. When the read action is performed, a read voltage Vr is provided to the region between source line SL and the bit line BL. That is, the voltage difference between the source line SL and the bit line BL is equal to the read voltage Vr. After the word line WL receives the on voltage, the P-type thin film transistor is turned on and the diode generates the read current.

Figure 2C:
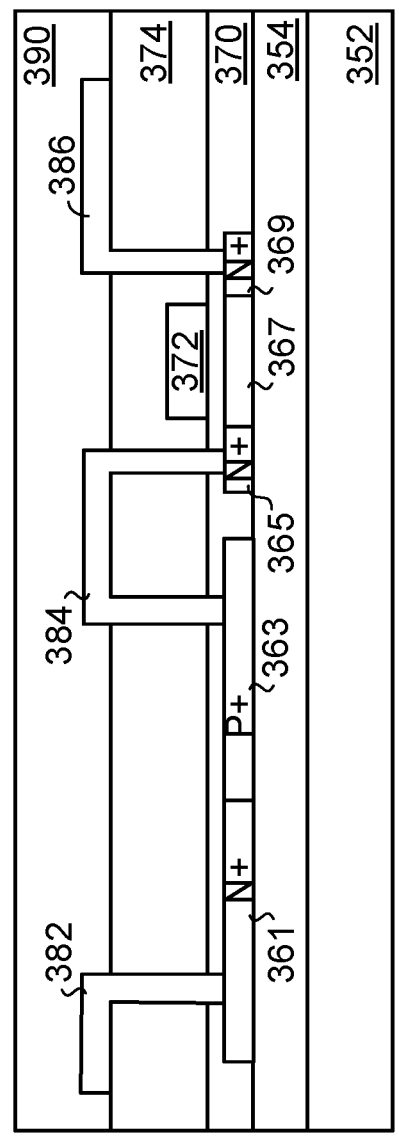
FIG. 2C is a schematic cross-sectional view illustrating an OTP non-volatile memory cell according to a second embodiment of the present invention.

The structure of the OTP non-volatile memory cell according to a second embodiment of the present invention will be described with reference to FIGS. 2C and 2D. FIG. 2C is a schematic cross-sectional view illustrating an OTP non-volatile memory cell according to a second embodiment of the present invention. FIG. 2D is a schematic circuit diagram illustrating the equivalent circuit of the OTP non-volatile memory cell according to the second embodiment of the present invention.

In this embodiment, the OTP non-volatile memory cell is manufactured by the low-temperature poly-silicon thin film transistor process. The OTP non-volatile memory cell comprises a switch element and a storage element. For example, the switch element is an N-type thin film transistor, and the storage element is a diode.

Please refer to FIG. 2C. Firstly, a buffer layer 354 is formed on a glass substrate 352, and two polysilicon layers are formed on the buffer layer 354. Then, two ion implantation processes are performed on the two polysilicon layers. Consequently, an N-type doped region (N+) 361 and a P-type doped region (P+) 363 are formed in the first polysilicon layer, and two N-type doped regions (N+) 365, 369 and a channel region 367 are formed in the second polysilicon layer. The channel region 367 is arranged between the two N-type doped regions (N+) 365 and 369. Alternatively, a lightly doped region is arranged between the N-type doped region (N+) 365 and the channel region 367, and another lightly doped region is arranged between the N-type doped region (N+) 369 and the channel region 367. Then, a gate dielectric layer 370 is formed over the two polysilicon layers. After a gate layer 372 is formed on the gate dielectric layer 370, an interlayer dielectric layer 374 is formed to cover the gate layer 372 and the gate dielectric layer 370. The gate layer 372 is located over the channel region 367. Then, three metal layers 382, 384 and 386 are formed on the interlayer dielectric layer 374. The first metal layer 382 is contacted with the N-type doped region (N+) 361 through a via. The second metal layer 384 is contacted with the P-type doped region (P+) 363 and the N-type doped region (N+) 365 through two vias. The first metal layer 382, the second metal layer 384 and the third metal layer 386 may be the same metal layer or different metal layers.

Please refer to FIG. 2D. The metal layer 382 is connected to a source line SL and used as the cathode of the diode. The metal layer 384 is used as both of the first drain/source terminal of the N-type thin film transistor and the anode of the diode. That is, the anode of the diode is connected with the first drain/source terminal of the N-type thin film transistor. The metal layer 386 is connected to a bit line BL and used as the second drain/source terminal of the N-type thin film transistor. The gate layer 372 of the N-type thin film transistor is connected to a word line WL.

When the program action is performed, a program voltage Vpp is provided to the region between source line SL and the bit line BL. That is, the voltage difference between the source line SL and the bit line BL is equal to the program voltage Vpp. After the word line WL receives an on voltage, the N-type thin film transistor is turned on and the diode is programmed to the second storage state. When the read action is performed, a read voltage Vr is provided to the region between source line SL and the bit line BL. That is, the voltage difference between the source line SL and the bit line BL is equal to the read voltage Vr. After the word line WL receives the on voltage, the N-type thin film transistor is turned on and the diode generates the read current.

In the manufacturing method of the OTP non-volatile memory cell, two ion implantation processes are required to produce the diode and form the P-type doped regions (P+) and the N-type doped regions (N+). During ion implantation, a photomask is required to perform a photolithography process. In other words, the two ion implantation processes need two different photomasks to perform two photolithography processes.

However, if there is misalignment between the two photomasks, the PN junction between the P-type doped region (P+) and the N-type doped region (N+) is possibly not formed. Consequently, the breakdown voltage of the diode is deviated. The influence of the misalignment on the PN junction will be described as follows.

FIGS. 3A to 3D schematically illustrate the photolithography processes for the storage element of the OTP non-volatile memory cell.

As shown in FIG. 3A, the polysilicon layer is formed on the buffer layer 404. After a first ion implantation process is performed through the first photomask, a P-type doped region 406 is formed in a first region of the polysilicon layer.

Meanwhile, a second region of the polysilicon layer has not undergone the ion implantation process.

Please refer to FIG. 3B. After a second ion implantation process is performed through the second photomask, the misalignment between the two photomasks is not generated. In addition, an N-type doped region 408a is formed in a second region of the polysilicon layer, and a PN junction 409 is formed between the N-type doped region 408a and the P-type doped region 406.

Please refer to FIG. 3C. After the second ion implantation process is performed through the second photomask, the misalignment between the two photomasks is generated. In addition, an N-type doped region 408b is formed in the second region of the polysilicon layer. Since there is a spacing region (i.e., an undoped region 410) between the N-type doped region 408b and the P-type doped region 406, the PN junction cannot be formed. Under this circumstance, a PIN diode is produced. Since the breakdown voltage of the PIN diode is lower (e.g., −40V), the absolute value of the breakdown voltage is higher. That is, it is difficult for the PIN diode to result in the junction breakdown.

Please refer to FIG. 3D. After the second ion implantation process is performed through the second photomask, the misalignment between the two photomasks is generated. In addition, an N-type doped region 408c is formed in the second region of the polysilicon layer. There is an overlap region 412 between the N-type doped region 408c and the P-type doped region 406. That is, the P-type doped region 406 and the N-type doped region 408c are partially overlapped. Under this circumstance, the diode with the overlapped PN doped region is produced. Generally, the breakdown voltage of the diode with the overlapped PN doped region is close to the breakdown voltage of the diode as shown in FIG. 3B.

Please refer to FIGS. 3B, 3C and 3D again. Since there is the undoped region 410 between the two doped regions 406 and 408b of the diode as shown in FIG. 3C, the PIN diode is produced. Since the breakdown voltage of the PIN diode is lower, the absolute value of the breakdown voltage is higher. When the program voltage Vpp of −20V is applied to the three diodes of FIGS. 3B, 3C and 3D, the storage state of the PIN diode as shown in FIG. 3C cannot be changed but the storage state of the diode as shown in FIGS. 3B and 3D cannot be changed.

In case that the non-volatile memory comprises three types of diodes as shown in FIGS. 3B, 3C and 3D, some problems occur because the breakdown voltages of different types of diodes in the non-volatile memory are different. After the program action is completed, the storage states of some memory cells are changed, but the storage states of other memory cells are possibly not changed. Under this circumstance, the non-volatile memory cannot be operated normally.

The present invention further provides some examples of the photomask patterns for the diode. By using the exemplary photomask patterns, the breakdown voltages of the storage elements in all memory cells of the non-volatile memory are very close. Consequently, during the program action, all non-volatile memory cells can change their storage states in response to the received program voltage Vpp.

Figure 4A:
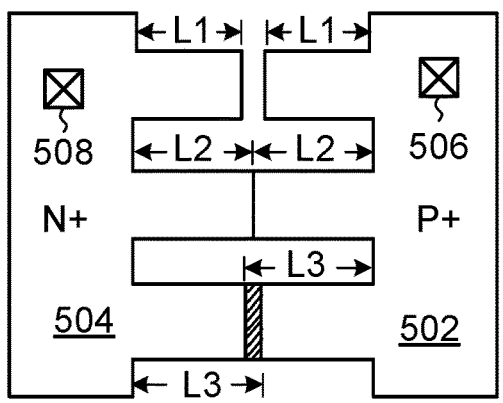
FIGS. 4A and 4B schematically illustrate a first example of the doped region pattern on the polysilicon layer and the equivalent circuit of the storage element.
Figure 4B:
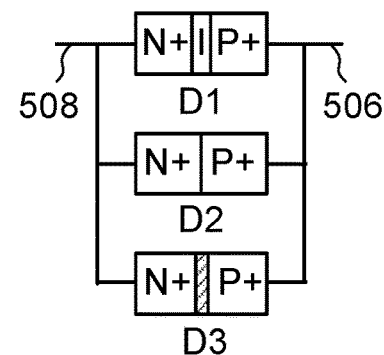

FIGS. 4A and 4B schematically illustrate a first example of the doped region pattern on the polysilicon layer and the equivalent circuit of the storage element. Please refer to FIG. 4A. After the two implantation processes are completed, a P-type doped region 502 and an N-type doped region 504 are formed in the polysilicon layer. Then, two metal layers 506 and 508 are formed. The two metal layers 506 and 508 are contacted with the P-type doped region 502 and the N-type doped region 504, respectively.

Moreover, three finger regions are extended from the P-type doped region 502. The first finger region has a length L1. The second finger region has a length L2. The third finger region has a length L3. Similarly, three finger regions are extended from the N-type doped region 504. The first finger region has a length L1. The second finger region has a length L2. The third finger region has a length L3. The length L1 is smaller than the length L2. The length L2 is smaller than the length L3.

Please refer to FIGS. 4A and 4B again. After the second ion implantation process is performed through the second photomask and the misalignment between the two photomasks is not generated, the two finger regions with the length L3 are collaboratively formed as a diode D3 with the overlapped PN doped region, the two finger regions with the length L2 are collaboratively formed as a diode D2 with the PN junction, and the two finger regions with the length L1 are collaboratively formed as a PIN diode D1. In other words, the storage element of the non-volatile memory cell can be considered as the parallel-connected structure of three diodes D1, D2 and D3.

As mentioned above, the storage element contains the diode D2 with the PN junction and the diode D3 with the overlapped PN doped region. Consequently, during the program action, it is confirmed that the storage state of at least one of the diodes D2 and D3 is changed. Since the three diodes D1, D2 and D3 are connected with each other in parallel, it is considered that the storage state of the storage element has been changed.

In this embodiment, three finger regions are extended from each of the P-type doped region 502 and the N-type doped region 504. Consequently, even if the misalignment is generated after the second ion implantation process, it is confirmed that at least diode of the storage element can be programmed successfully.

It is noted that the number of the finger regions extended from the doped region and the lengths of the finger regions are not restricted to those shown in the drawings.

FIGS. 4C to 4F schematically illustrate a second example of the doped region pattern on the polysilicon layer and the equivalent circuit of the storage element. Please refer to FIG. 4C. After the two implantation processes are completed, two P-type doped regions 512, 514 and an N-type doped region 516 are formed in the polysilicon layer. The N-type doped region 516 is arranged between the two P-type doped regions 512 and 514. Then, a metal layer 522 is formed and contacted with the two P-type doped regions 512 and 514, and a metal layer 526 is contacted with the N-type doped region 516.

Figure 4C:
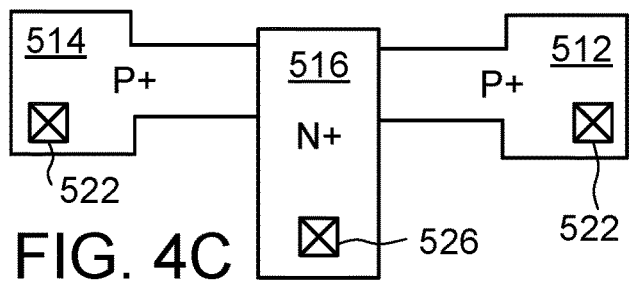
FIGS. 4C to 4F schematically illustrate a second example of the doped region pattern on the polysilicon layer and the equivalent circuit of the storage element.
Figure 4D:
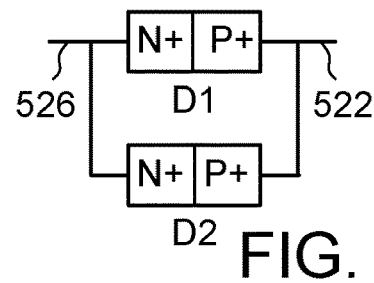

Please refer to FIGS. 4C and 4D. After the second ion implantation process is performed through the second photomask and the misalignment between the two photomasks is not generated, two diodes D1 and D2 with the PN junctions are produced. In other words, the storage element of the non-volatile memory cell can be considered as the parallel-connected structure of two diodes D1 and D2.

As mentioned above, the storage element contains the two diodes D1 and D2 with the PN junctions. Consequently, during the program action, it is confirmed that the storage state of at least one of the diodes D1 and D2 is changed. Since the two diodes D1 and D2 are connected with each other in parallel, it is considered that the storage state of the storage element has been changed.

Figure 4E:
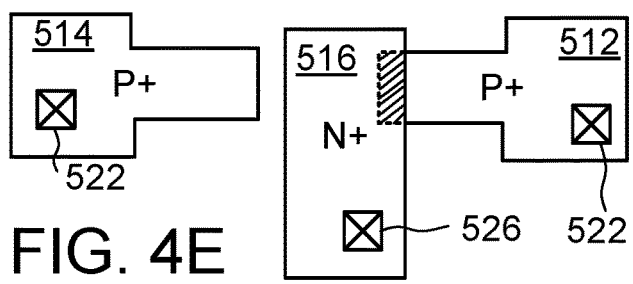
Figure 4F:
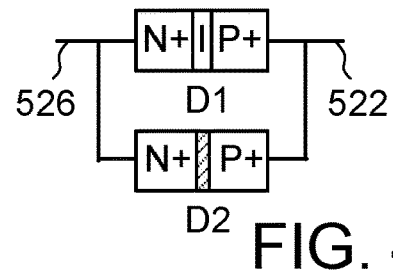

Please refer to FIGS. 4E and 4F. After the second ion implantation process is performed through the second photomask, the misalignment between the two photomasks is generated. Due to the misalignment, a PIN diode D1 and a diode D2 with the overlapped PN doped region are produced. In other words, the storage element of the non-volatile memory cell can be considered as the parallel-connected structure of two diodes D1 and D2.

As mentioned above, the storage element contains the diode D2 with the overlapped PN doped region. Consequently, during the program action, the storage state of the diode D2 is changed. Since the three diodes D1 and D2 are connected with each other in parallel, it is considered that the storage state of the storage element has been changed.

FIGS. 4G to 4J schematically illustrate a third example of the doped region pattern on the polysilicon layer and the equivalent circuit of the storage element. After the two implantation processes are completed, a P-type doped region 532 and an N-type doped region 534 are formed in the polysilicon layer. The P-type doped region 532 is arranged around the N-type doped region 534. Then, a metal layer 536 is formed and contacted with the P-type doped region 532, and a metal layer 538 is contacted with the N-type doped region 534.

Figure 4G:
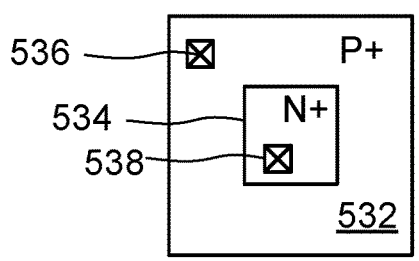
FIGS. 4G to 4J schematically illustrate a third example of the doped region pattern on the polysilicon layer and the equivalent circuit of the storage element.
Figure 4I:
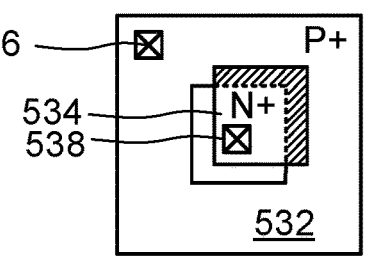
Figure 4H:
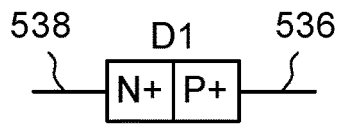

Please refer to FIGS. 4G and 4H. After the second ion implantation process is performed through the second photomask and the misalignment between the two photomasks is not generated, a diode D1 the PN junction is produced. In other words, the storage element of the non-volatile memory cell comprises the diode D1. Consequently, when the program action is performed, the storage state of the storage element is changed.

Figure 4J:
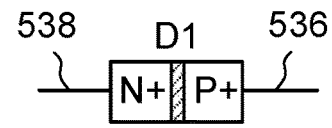

Please refer to FIGS. 4I and 4J. After the second ion implantation process is performed through the second photomask, the misalignment between the two photomasks is generated. Due to the misalignment, a diode D1 with the overlapped PN doped region is produced. In other words, the storage element of the non-volatile memory cell comprises the diode D1 with the overlapped PN doped region. Consequently, when the program action is performed, the storage state of the storage element is changed.

The profiles of the doped region patterns as shown in FIGS. 4G and 4H are presented herein for purpose of illustration and description only. For example, in another embodiment, the N-type doped region 534 has a polygonal profile, a circular profile or any other appropriate profile.

FIGS. 5A and 5B schematically illustrate a fourth example of the doped region pattern on the polysilicon layer and the equivalent circuit of the storage element. As shown in FIGS. 5A and 5B, a dummy gate layer 602 is used to block the polysilicon layer. After the two implantation processes are completed, a P-type doped region 604 and an N-type doped region 606 are formed in the polysilicon layer. Then, two metal layers 614 and 616 are formed. The two metal layers 614 and 616 are contacted with the P-type doped region 604 and the N-type doped region 606, respectively.

Due to the dummy gate layer 602, the region between the P-type doped region 604 and the N-type doped region 606 is an undoped region. Since the distance between the P-type doped region 604 and the N-type doped region 606 is fixed, the storage element is not influenced by the misalignment of the ion implantation processes. Under this circumstance, the storage element is a PIN diode D1.

Since the storage elements of all OTP non-volatile memory cells are PIN diodes, the breakdown voltages are equal. During the program action, the program voltage may be set as −40V. Consequently, the storage state of the storage element is changed.

FIGS. 5C and 5D schematically illustrate a fifth example of the doped region pattern on the polysilicon layer and the equivalent circuit of the storage element. As shown in FIGS. 5C and 5D, a gate layer 622 is used to block the polysilicon layer. After the two implantation processes are completed, a P-type doped region 624 and an N-type doped region 626 are formed in the polysilicon layer. Then, three metal layers 632, 634 and 636 are formed. The three metal layers 632, 634 and 636 are contacted with the gate layer 622, the P-type doped region 624 and the N-type doped region 626, respectively. Due to the gate layer 622, the region between the P-type doped region 624 and the N-type doped region 626 is an undoped region. Under this circumstance, the storage element is a PIN diode D1. In addition, the metal layer 632 receives a coupling voltage Sc. Consequently, the gate layer 622 may be considered as a coupling terminal. That is, the storage element is the PIN diode D1 with a coupling terminal to receive the coupling voltage Sc. According to the coupling voltage Sc, the breakdown voltage of the PIN diode D1 can be controlled. Moreover, in case that the distance between the P-type doped region 624 and the N-type doped region 626 is larger, the breakdown voltage of the diode is lower. That is, the absolute value of the breakdown voltage is higher. The arrangement of the metal layer 632 can reduce the breakdown voltage of the PIN diode D1.

FIGS. 5E and 5F schematically illustrate a sixth example of the doped region pattern on the polysilicon layer and the equivalent circuit of the storage element. As shown in FIGS. 5E and 5F, a dummy gate layer 642 is used to block a portion of the polysilicon layer. After the two implantation processes are completed, a P-type doped region 644 and an N-type doped region 646 are formed in the polysilicon layer. Then, two metal layers 654 and 656 are formed. The two metal layers 654 and 656 are contacted with the P-type doped region 644 and the N-type doped region 646, respectively. Since only a portion of the polysilicon layer is blocked by the dummy gate layer 642, a PN junction is formed between the P-type doped region 644 and the N-type doped region 646. Under this circumstance, the storage element is a diode D1 with the PN junction. Moreover, since the size of the PN junction is adjusted by the dummy gate layer 642, the breakdown voltage is correspondingly controlled. Generally, as the size of the PN junction is increased, the breakdown voltage of the diode is increased. That is, the absolute value of the breakdown voltage is lower, and the storage element is programmed more easily.

In other words, the storage element of the non-volatile memory cell comprises the diode D1 with the PN junction. Consequently, when the program action is performed, the storage state of the storage element is changed.

FIGS. 5G and 5H schematically illustrate a seventh example of the doped region pattern on the polysilicon layer and the equivalent circuit of the storage element. As shown in FIGS. 5G and 5H, a gate layer 662 is used to block a portion of the polysilicon layer. After the two implantation processes are completed, a P-type doped region 664 and an N-type doped region 666 are formed in the polysilicon layer. Then, three metal layers 672, 674 and 676 are formed. The three metal layers 672, 674 and 676 are contacted with the gate layer 662, the P-type doped region 664 and the N-type doped region 666, respectively. Since only a portion of the polysilicon layer is blocked by the gate layer 622, a PN junction is formed between the P-type doped region 644 and the N-type doped region 646. Under this circumstance, the storage element is a diode D1 with the PN junction. Moreover, the size of the PN junction is adjustable by the gate layer 662, and the gate layer 622 may be considered as a coupling terminal to receive the coupling voltage Sc. According to the coupling voltage Sc, the breakdown voltage of the diode D1 can be controlled. That is, the storage element is the diode D1 with the PN junction, and storage element has the coupling terminal to receive the coupling voltage Sc to control the breakdown voltage of the diode D1.

Moreover, the embodiments of FIGS. 4A, 4C, 4E, 4G, 4I, 5A, 5C, 5E and 5G may be modified. For example, plural identical metal layers are contacted with the P-type doped region and/or the N-type doped region. For example, in a variant example of the structure as shown in FIG. 4G, the storage element is equipped with plural metal layers 536. The plural metal layers 536 are uniformly distributed relative to the center of the N-type doped region 534 and contacted with the P-type doped region 532. Consequently, the P-type doped region 532 can uniformly receive the voltage through the metal layers 536.

From the above descriptions, the present invention provides a OTP non-volatile memory cell on a glass substrate. The non-volatile memory cell comprises a switch element and a storage element. The storage element comprises at least one diode. According to the structural design, the breakdown voltages of the storage elements of all non-volatile memory cells are close to each other. Consequently, during the program action, all non-volatile memory cells can change their storage states in response to the received program voltage.

The examples of the above photomask patterns are presented herein for purpose of illustration and description only. It is noted that the photomask patterns may be varied according to the practical requirements. Consequently, the breakdown voltages of the storage elements of all non-volatile memory cells are close to each other.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A one time programmable (OTP) non-volatile memory cell comprising a storage element and a switch element, wherein the storage element comprises:
   a glass substrate;
   a buffer layer disposed on the glass substrate;
   a first polysilicon layer disposed on the buffer layer, wherein a first P-type doped region and a first N-type doped region are formed in the first polysilicon layer;
   a gate dielectric layer covering the first polysilicon layer;
   an interlayer dielectric layer covering the gate dielectric layer;
   a first metal layer disposed on the interlayer dielectric layer, wherein the first metal layer is contacted with the first N-type doped region through a first via; and
   a second metal layer disposed on the interlayer dielectric layer, wherein the second metal layer is contacted with the first P-type doped region through a second via, wherein the first metal layer, the first N-type doped region, the first P-type doped region and the second metal layer are collaboratively formed as a first diode;
   wherein the switch element comprises:
   a second polysilicon layer arranged between the buffer layer and the gate dielectric layer, wherein the second polysilicon layer comprises a second P-type doped region, a third P-type doped region and a channel region, wherein the channel region is arranged between the second P-type doped region and the third P-type doped region;
   a gate layer formed on the gate dielectric layer and located over the channel region, wherein the gate layer is covered by the interlayer dielectric layer;
   the first metal layer contacted with the second P-type doped region through a third via; and
   a third metal layer disposed on the interlayer dielectric layer, wherein the third metal layer is contacted with the third P-type doped region through a fourth via, wherein the gate layer, the first metal layer, the second P-type doped region, the channel region, the third P-type doped region and the third metal layer are collaboratively formed as a P-type thin film transistor;
   wherein when a program action is performed, the first diode receives a program voltage, wherein in response to the program voltage, the first diode is reverse-biased, and the first diode is switched from a first storage state to a second storage state,
   wherein when a read action is performed, the first diode receives a read voltage, wherein in response to the read voltage, the first diode is reverse-biased and the first diode generates a read current.

2. The OTP non-volatile memory cell as claimed in claim 1, further comprising an organic planarization layer, wherein the first metal layer, the second metal layer and the interlayer dielectric layer are covered by the organic planarization layer.

3. The OTP non-volatile memory cell as claimed in claim 1, wherein the second metal layer is connected to a bit line, the gate layer is connected to a word line, and the third metal layer is connected to a source line.

4. A one time programmable (OTP) non-volatile memory cell comprising a storage element and a switch element, wherein the storage element comprises:
   a glass substrate;
   a buffer layer disposed on the glass substrate;
   a first polysilicon layer disposed on the buffer layer, wherein a first P-type doped region and a first N-type doped region are formed in the first polysilicon layer;
   a gate dielectric layer covering the first polysilicon layer;
   an interlayer dielectric layer covering the gate dielectric layer;
   a first metal layer disposed on the interlayer dielectric layer, wherein the first metal layer is contacted with the first N-type doped region through a first via; and
   a second metal layer disposed on the interlayer dielectric layer, wherein the second metal layer is contacted with the first P-type doped region through a second via, wherein the first metal layer, the first N-type doped region, the first P-type doped region and the second metal layer are collaboratively formed as a first diode;
   wherein the switch element comprises:
   a second polysilicon layer arranged between the buffer layer and the gate dielectric layer, wherein the second polysilicon layer comprises a second N-type doped region, a third N-type doped region and a channel region, wherein the channel region is arranged between the second N-type doped region and the third N-type doped region;
   a gate layer formed on the gate dielectric layer and located over the channel region, wherein the gate layer is covered by the interlayer dielectric layer;
   the second metal layer contacted with the second N-type doped region through a third via; and a third metal layer disposed on the interlayer dielectric layer, wherein the third metal layer is contacted with the third N-type doped region through a fourth via, wherein the gate layer, the second metal layer, the second N-type doped region, the channel region, the third N-type doped region and the third metal layer are collaboratively formed as an N-type thin film transistor;

wherein when a program action is performed, the first diode receives a program voltage, wherein in response to the program voltage, the first diode is reverse-biased, and the first diode is switched from a first storage state to a second storage state, wherein when a read action is performed, the first diode receives a read voltage, wherein in response to the read voltage, the first diode is reverse-biased and the first diode generates a read current.

5. The OTP non-volatile memory cell as claimed in claim 4, wherein the first metal layer is connected to a source line, the gate layer is connected to a word line, and the third metal layer is connected to a bit line.

6. The OTP non-volatile memory cell as claimed in claim 4, wherein the first diode comprises a PN junction formed by contacting the first P-type doped region with the first N-type doped region.

7. The OTP non-volatile memory cell as claimed in claim 6, wherein the storage element further comprises a second diode and a third diode, wherein the second diode is a diode with an overlapped PN doped region, and the third diode is a PIN diode, wherein the first diode, the second diode and the third diode are connected with each other in parallel.

8. The OTP non-volatile memory cell as claimed in claim 6, wherein the storage element further comprises a second diode, wherein the second diode is a diode with the PN junction, and the first diode and the second diode are connected with each other in parallel.

9. The OTP non-volatile memory cell as claimed in claim 4, wherein the first P-type doped region and the first N-type doped region are partially overlapped, so that the first diode is a diode with an overlapped PN doped region.

10. The OTP non-volatile memory cell as claimed in claim 9, wherein the storage element further comprises a second diode, wherein the second diode is a PIN diode, and the first diode and the second diode are connected with each other in parallel.

11. The OTP non-volatile memory cell as claimed in claim 4, further comprising:

an undoped region located between the first P-type doped region and the first N-type doped region, and the first diode is a PIN diode.

* * * * *